United States Patent
Khan

(10) Patent No.: US 10,854,407 B2
(45) Date of Patent: Dec. 1, 2020

(54) METHOD TO DETECT OPERATIONAL STATE OF REMOTE DISCONNECT LATCHING RELAY

(71) Applicant: SENSUS SPECTRUM, LLC, Raleigh, NC (US)

(72) Inventor: Zafarullah Khan, Kenner, LA (US)

(73) Assignee: Sensus Spectrum, LLC, Raleigh, NC (US)

( * ) Notice: Subject to any disclaimer, the term of this patent is extended or adjusted under 35 U.S.C. 154(b) by 85 days.

(21) Appl. No.: 16/104,698

(22) Filed: Aug. 17, 2018

(65) Prior Publication Data

US 2019/0057827 A1 Feb. 21, 2019

Related U.S. Application Data

(60) Provisional application No. 62/547,251, filed on Aug. 18, 2017.

(51) Int. Cl.
| | |
|---|---|
| *G01R 31/327* | (2006.01) |
| *H01H 47/00* | (2006.01) |
| *H01H 50/18* | (2006.01) |
| *H01H 50/64* | (2006.01) |

(Continued)

(52) U.S. Cl.
CPC ....... *H01H 47/002* (2013.01); *G01R 31/3278* (2013.01); *H01H 47/22* (2013.01); *H01H 50/18* (2013.01); *H01H 50/36* (2013.01); *H01H 50/641* (2013.01)

(58) Field of Classification Search
CPC .............. G01R 31/327; G01R 31/3272; G01R 31/3278
See application file for complete search history.

(56) References Cited

U.S. PATENT DOCUMENTS

| | | | |
|---|---|---|---|
| 3,988,664 A | * 10/1976 | Beery | G06K 13/04 324/423 |
| 4,321,946 A | 3/1982 | Paulos et al. | |

(Continued)

FOREIGN PATENT DOCUMENTS

| | | |
|---|---|---|
| EP | 1172527 A2 | 1/2002 |
| WO | 2017055031 A1 | 4/2017 |

OTHER PUBLICATIONS

International Search Report and Written Opinion issued in counterpart PCT Application No. PCT/US2018/046940 dated Feb. 11, 2019 (10 (ten) pages).

*Primary Examiner* — Walter L Lindsay, Jr.
*Assistant Examiner* — Milton Gonzalez
(74) *Attorney, Agent, or Firm* — Olive Law Group LLC; Ronald A. Rudder

(57) ABSTRACT

A method and system for monitoring a state of a relay switch. The method applies a voltage signal to a solenoid of the relay switch for actuation of the relay switch, monitors over time current flowing through the solenoid after application of the voltage signal, and calculates a back-emf voltage impressed on the solenoid based on an inflection in the current occurring as a plunger of the relay switch moves. The system includes a voltage source, at least one solenoid solenoid having a plunger, a switch connected to the plunger, and a controller configured to data log the voltage applied to the solenoid and the current flowing through the solenoid upon application of the voltage.

20 Claims, 6 Drawing Sheets

(51) Int. Cl.
*H01H 47/22* (2006.01)
*H01H 50/36* (2006.01)

(56) References Cited

U.S. PATENT DOCUMENTS

| | | | |
|---|---|---|---|
| 5,153,522 A * | 10/1992 | Sano | F16K 31/0675 324/546 |
| 5,241,218 A * | 8/1993 | Page | G01R 31/72 307/104 |
| 5,267,120 A | 11/1993 | Graff et al. | |
| 5,270,900 A * | 12/1993 | Alden | H01H 47/22 361/153 |
| 5,406,439 A | 4/1995 | Crane et al. | |
| 5,757,598 A | 5/1998 | Aromin | |
| 6,051,895 A | 4/2000 | Mercier | |
| 6,233,132 B1 * | 5/2001 | Jenski | H01H 9/56 361/152 |
| 6,418,003 B1 * | 7/2002 | Xiang | F01L 9/04 361/146 |
| 6,469,500 B1 * | 10/2002 | Schmitz | B60G 17/01933 123/90.11 |
| 6,753,664 B2 | 6/2004 | Neufeld et al. | |
| 6,903,554 B2 | 6/2005 | Wilson et al. | |
| 7,405,917 B2 * | 7/2008 | Ahrens | F16K 31/06 361/152 |
| 8,055,460 B2 * | 11/2011 | Rajagopalan | G01R 31/2829 324/415 |
| 8,183,719 B2 | 5/2012 | Scripca et al. | |
| 8,350,648 B2 | 1/2013 | Cueto | |
| 8,520,349 B2 | 8/2013 | Billingsley et al. | |
| 9,262,708 B2 | 2/2016 | Gomi | |
| 9,287,074 B2 | 3/2016 | Nam et al. | |
| 9,640,336 B2 | 5/2017 | Zhong et al. | |
| 9,685,821 B2 | 6/2017 | Lee et al. | |
| 2011/0280737 A1 | 11/2011 | Sarkinen et al. | |
| 2014/0002093 A1 | 1/2014 | Elliott et al. | |
| 2014/0354269 A1 | 12/2014 | Stevens | |
| 2015/0170860 A1 | 6/2015 | Ahmed et al. | |
| 2016/0125993 A1 | 5/2016 | Narayanasamy et al. | |
| 2016/0131712 A1 | 5/2016 | Bock et al. | |
| 2016/0314919 A1 | 10/2016 | Broker et al. | |
| 2017/0062163 A1 | 3/2017 | Nishio | |
| 2017/0186577 A1 | 6/2017 | Haines et al. | |
| 2019/0156982 A1 * | 5/2019 | Lecheler | G05B 23/0267 |

* cited by examiner

METHOD TO DETECT OPERATIONAL STATE OF REMOTE DISCONNECT LATCHING RELAY

CROSS REFERENCE TO RELATED APPLICATIONS

This application is related to and claims priority to U.S. Ser. No. 62/547,251, entitled "METHOD TO DETECT OPERATIONAL STATE OF REMOTE DISCONNECT LATCHING RELAY," filed Aug. 18, 2017, the entire contents of which are incorporated herein by reference.

BACKGROUND OF THE INVENTION

Field of Invention

The invention relates to circuits and devices for switching solenoids, relays and other direct current DC latching devices.

Discussion of the Background

Relays are widely used to control the flow of power from AC power sources to various types of electrical loads. Relays can also be used to control the flow of fluids from one source to a delivery point. A typical electromechanical relay includes one or more sets of contacts that open or close to establish and interrupt the flow of power. In these devices, an electromagnetic coil is energized or de-energized to move an actuator that opens or closes. The application of voltage to the electromagnetic coil causes current flow which generates the magnetic field. Current flow in the electromagnetic coil (i.e. a solenoid) produces the magnetic field which pulls a contact from one state (open) to another state (closed) or vice versa. Typically, there are one or more springs or latching magnets used to keep the relay in one state or the other, and the magnetic field generated by one or more solenoids overcomes the spring or latching magnet forces.

In some cases, there is a plunger made of a magnetic material which sits inside or near the solenoid. The plunger of a DC latching device can be mechanically connected to an actuator for movement of an electrical contact to open or close an electrical switch or for movement of a valve seat to open or close a fluid flow valve. Current flow in the solenoid causes the plunger to move in one direction. An opposite current flow causes the plunger to move in an opposite direction. For example, the plunger of a DC latching solenoid can be connected to a seal in an irrigation valve, which opens and closes over a valve orifice in order to control the flow of water to and from the switching device, thus controlling the OPEN and CLOSED state of the valve. Meanwhile, in an electrical relay, for example, the plunger may be connected to a plate with electrical contacts on the end. These electrical contacts make or break a connection to another set of electrical contacts, depending on the position of the plunger, which controls the flow of electricity.

In other configurations of a latching relay, a magnetic strip is balanced between the two wire coils or solenoids. Electrical current in one coil producing a magnetic pulse moves the magnetic strip, and the switch is moved from one state to another. Another magnetic pulse is needed to move the switch back to its original state.

DC latching solenoids and relays are used in many applications involving fluid flow control and electrical control. These devices typically use pulses of energy to establish one of several stable states, although a DC latching device with two stable states is one of the most common arrangements. The primary advantage of a DC latching solenoid or relay is that it uses zero energy once it is latched. Thus, these devices can be used in battery-operated controls where conservation of energy is important and/or limited power is available.

SUMMARY OF THE INVENTION

In one embodiment, there is provided a method for monitoring a state of a relay switch. The method applies a voltage signal to a solenoid of the relay switch for actuation of the relay switch, monitors over time current flowing through the solenoid after application of the voltage signal, and calculates a back-emf voltage impressed on the solenoid based on an inflection in the current occurring as a plunger of the relay switch moves.

In one embodiment, there is provided a system for monitoring a state of a relay switch. The system includes a voltage source, at least one solenoid having a plunger, a switch connected to the plunger, and a controller configured to data log the voltage applied to the solenoid and the current flowing through the solenoid upon application of the voltage.

In one embodiment, there is provided a method for determining a state of a relay switch after actuation of the relay switch. The method compares a calculated back-emf voltage to a predetermined back-emf voltage associated with the relay switch in order to decide whether the relay switch changed between a closed state and an open state.

In one embodiment, there is provided a system for determining a state of a relay switch after actuation of the relay switch. The system includes a voltage source, at least one solenoid having a plunger, a switch connected to the plunger, and a controller configured to data log the voltage applied to the solenoid and the current flowing through the solenoid upon application of the voltage. The controller is further configured to compare a calculated back-emf voltage to a predetermined back-emf voltage associated with the relay switch in order to decide whether the relay switch changed between a closed state and an open state.

It is to be understood that both the foregoing general description of the invention and the following detailed description are exemplary, but are not restrictive of the invention.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Off the shelf latching relay devices RD typically do not have a feedback mechanism to indicate the operational state of a relay device. In order to detect the state of the relay device, conventionally, a sensor (or sensors) needs to be added to the relay structure adding to the cost and process time. Furthermore, where movement of the RD between open and closed states is short (e.g., on the order of a mm), it may not be practically feasible or at a reasonable cost to discern the state of the relay with a simple Hall effect or other sensor. This invention provides a way to detect the operational state of a latching type relay device RD without the use of position sensors such as Hall effect sensors etc. More specifically, the invention sets forth a method and system for detecting an operational state of a relay device operated with a DC voltage applied to a solenoid activating the relay device.

Figure 1A:
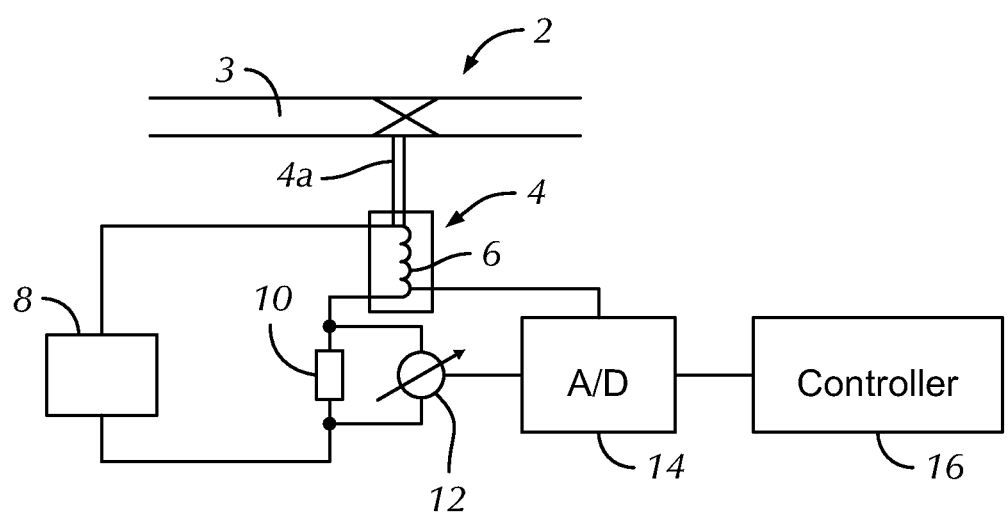
FIG. 1A is a schematic depiction of a system according to one embodiment of the invention for monitoring a state of a relay switch.

An illustrative system for determining the state of a relay device 4 is illustrated in FIG. 1A, where the relay device 4 operates switch 2 in an electrical or fluid flow line 3. This system includes a controller 16 controlling DC power source 8 capable of applying a DC voltage across solenoid (or coil) 6. A resistive shunt 10 is included between the DC power source 8 and the solenoid 6. Current flowing through the resistive shunt 10 produces a voltage related to the amount of current flowing in series to and through solenoid 6. A voltage meter (or voltage measuring device) 12 detects the voltage. An analogue to digital converter 14 digitizes the voltage supplied to controller 16. Controller 16 reads and stores (data logs) the voltages and converts the voltages to values of current based on the known resistance of shunt 10. Other current sensors could be used in this invention.

The application of a DC voltage causes current to flow in solenoid 6. The current rise in solenoid 6 is limited by the impedance of the coil of the solenoid to a changing current flow and the resistance of the coil. Additionally, when plunger 4a of solenoid 6 moves into or out of the solenoid 6 (i.e., into and out of the coil forming the solenoid), a back EMF voltage is induced into the windings of the coil which causes an inflection in the current as the induced back EMF voltage opposes the current flow. When the plunger stops moving, the current increase returns to its normal exponential behavior with the steady state value of the current limited by the resistance of the solenoid.

In one embodiment of the invention, controller 16 measures and stores current vs. time data from the onset of the DC voltage until the current asymptotically reaches its limit or is beyond the inflection point(s) discussed below. The shape of the waveform can be stored in controller 16 and may be one criteria for assessing whether the relay device changed states by motion of the plunger.

Figure 1B:
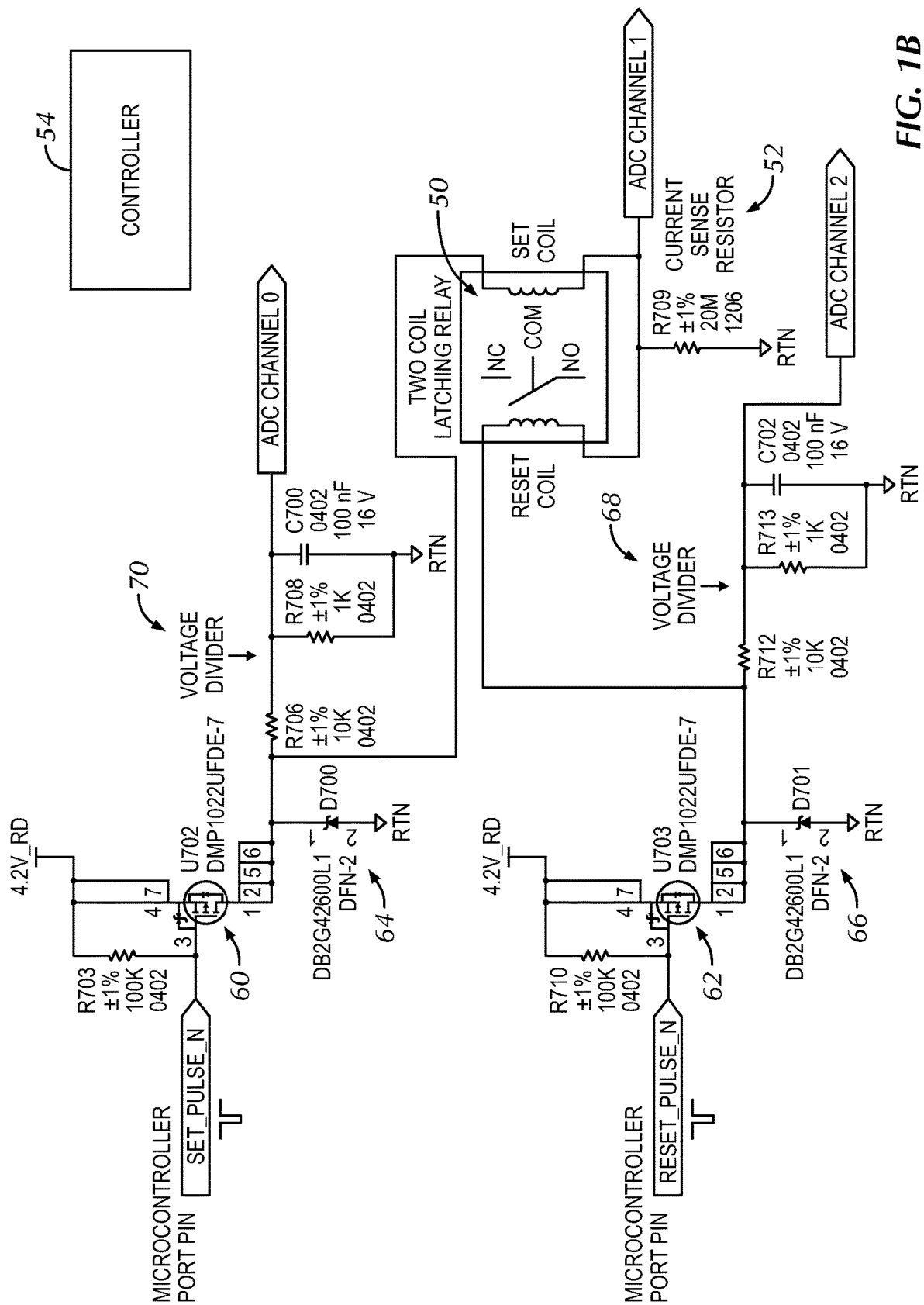
FIG. 1B is a schematic depiction of a relay device for use with the invention.

FIG. 1B is a schematic depiction of a specific relay device for use with the invention. In this schematic depiction, there is a two coil latching relay 50. Latching relay 50 has two coils as shown with one coil used to set the relay ("on" state), and the other coil is used to reset the relay ("off" state). The negative side of the coils are tied together and returned to circuit common through a current sense resistor 52 (a shunt resistor). The voltage across the current sense resistor is sensed by ADC channel 1 of the microcontroller 54. This allows the microcontroller 54 to determine coil current since the current sense resistor 52 has a known resistance (e.g., 20 mOhm). Additionally, as shown in FIG. 1B, there are two P-channel MOSFETs 60, 62 that are turned on by the set and reset pulse respectively. The "ON" duration of MOSFETs 60, 62 is equal to the length of the set/reset pulse. Only one MOSFET is on at any given time. When a MOSFET is on, the 4.2V_RD voltage rail is applied to the appropriate coil, and the relay changes state accordingly.

Additionally, as shown in FIG. 1B, there are two diodes 64, 66 which allow the coil current to keep flowing after the MOSFET turns off, thus preventing voltage stress on the MOSFETs due to coil self-inductance. Furthermore, as shown in FIG. 1B, there are two voltage dividers 68, 70. Voltage dividers 68, 70 can be 11:1 voltage dividers connected to the ADC channels of microcontroller 54. In this way, microcontroller 54 can measure the instantaneous coil voltage.

While described in detail below using a square voltage pulse, other pulse shapes can be used, and the calculations below would compensate for the non-square wave pulse shape to thereby determine the magnitude of back EMF voltage induced and how the determined back EMF should compare to a motion threshold.

As noted above, a solenoid driven latching relay such as latching relay 50 uses electrical energy to produce motion. This motion is used to open or close one or more contacts. Because electrical energy is converted to motion in a latching relay, an electromotive force (i.e., a voltage) is induced in the coil of a solenoid while the metallic plunger moves insider the coil. This voltage opposes the original applied voltage; therefore, it is called "back-electromotive force" or hereinafter back EMF. With an opposing voltage, the current flowing into the solenoid is reduced. This back EMF opposes the applied voltage resulting in lower current through the relay solenoid. The total voltage across the coil is then:

$$V = IR + \text{BACK\_EMF} \tag{1}$$

Rearranging this equation yields:

$$I = (V - \text{BACK\_EMF})/R \tag{2}$$

where V is the applied voltage, I the solenoid current and R is the solenoid resistance. If the coil resistance R, the applied voltage V. and the coil current I are known, the back EMF can be calculated using equation 1.

Figure 2:
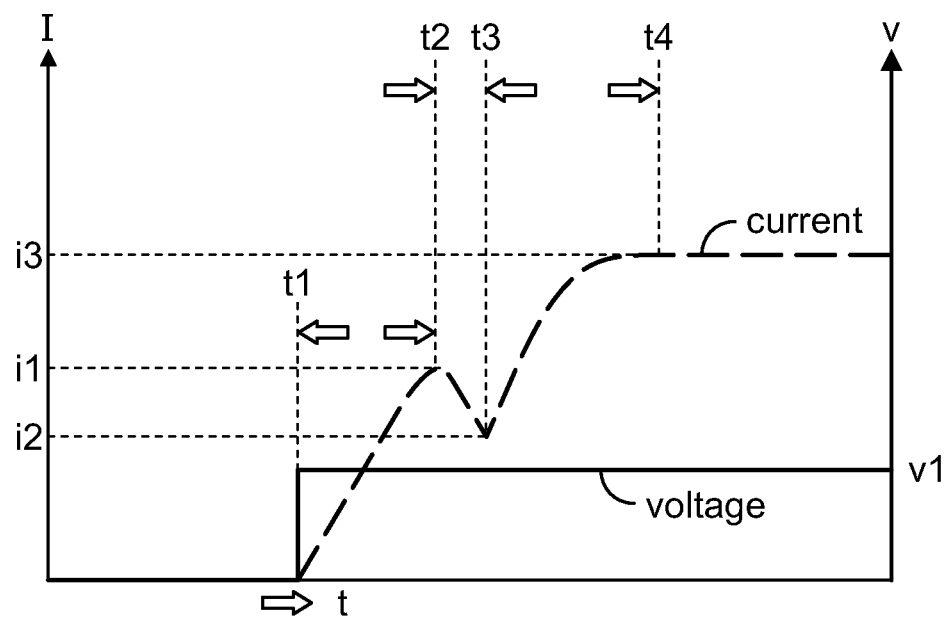
FIG. 2 is a schematic depiction of the variation of solenoid current after a voltage step is applied to the solenoid.

FIG. 2 is a depiction of the variation of the solenoid current (upper trace) when a voltage step (lower trace) is applied to the solenoid at time t1.

Prior to time t1, the current through the solenoid was zero. After time t1, the current starts rising at a rate dependent on the self-inductance of the solenoid. During this time, the back emf is zero, because the plunger has not moved. The following equation controls:

$$v1 = L(di/dt) + iR \tag{3}$$

where v1 is the applied voltage, L is the self-inductance of the solenoid, and R is the resistance of the solenoid.

At time t2, the current reaches a value equal to the activation current i1 of the relay and the plunger starts moving.

Between time t2 and t3, the plunger accelerates until it reaches the end of its movement and is brought to an abrupt halt. During this time, the back EMF increases from zero to its maximum value v(max). The back EMF opposes the applied voltage, and as a consequence the solenoid current gradually decreases from i1 to i2.

$$v1 = L(di/dt) + iR + v \tag{4}$$

where v is the instantaneous value of the back emf.
The minimum value of the current i2 is given by:

$$v1 = L(di/dt) + (i2)R + v(\text{max}) \quad (5)$$

where v(max) is the peak value of the back emf

At time t3, the plunger has stopped and the back EMF returns to zero.

Between time t3 and t4, the solenoid current starts increasing again because the back EMF that opposed the applied voltage is zero. The rate of rise in the current between time t3 and t4 is dependent on the self-inductance of the solenoid.

At time t4, the solenoid current reaches its steady state (asymptotic) value i3, where R is the resistance of the solenoid and v1 is the applied voltage.

$$v1 = (i3)R \quad (6)$$

In one embodiment of the invention, an analog to digital converter 14 is used to read i3 and v1, and the solenoid resistance R is calculated using equation (6)

$$R = v1/i3 \quad (7)$$

This value of R can be substituted in equation (3) and used to calculate L, where L is the inductance of the solenoid $$L = (v1 - iR)/(di/dt) \quad (8)$$

The values of R and L calculated in (7) and (8) can be substituted in equation (5) and used to calculate the maximum value of back EMF v(max).

$$v(\text{max}) = v1 - L(di/dt) - (i2)R \quad (9)$$

In this way, the magnitude of the back EMF is calculated based on current vs. time data recorded after application of a voltage to the solenoid.

In one embodiment of the invention, since the back EMF depends upon the speed of plunger movement, the faster the plunger moves, the greater the magnitude of the back EMF. The peak back EMF v(max) therefore has a strong correlation with the final speed reached by the plunger. In one embodiment of the invention, any partial or incomplete movement of the plunger where the relay does not change state will result in a lower value of the peak back EMF.

In one embodiment of the invention, a specific relay device is tested ahead of installation so that its back EMF values are known when changing states between an open to closed state and vice versa. These "normal" values are stored in memory of the controller 16 for reference.

Techniques such as waveform processing and analysis may be used to accurately identify the inflection points at t3 and at t2 (shown in FIG. 2) by way of numeric filtering and smoothing of the data and derivative processing to show the inflection points. The waveform processing for example can compare waveforms and profiles to confirm movement of the switch between states or to ascertain the aging or changing of the mechanical and electrical characteristics of the relay device. Waveform processing can determine waveform attributes such as slopes, inflection points, curvatures, calculate actuation delay times, asymptotic limits etc. A memory may be included in controller 16 (or remote therefrom) to store waveforms, profiles, inflection points, curvatures, calculated delay times, results of decisions, etc. Any of the functionality of the controller 16 may be implemented with analog and/or digital hardware, software, firmware or any suitable combination thereof.

In one embodiment of the invention, by analyzing the waveform of the current flowing through the coil 6 of relay device 4, different faults of the relay device can be detected and distinguished from each other. Such as for example, if the solenoid has any of its turns shorted out its resistance will change resulting in a different asymptotic level of current being obtained. The slope of the current rise will be indicative of the inductance of coil 6 in the relay device. A change in slope could be indicative of a change in shape of the coil or the normal position of plunger 4a to the coil 6 prior to plunger movement.

In one embodiment of the invention, waveform analysis can verify that that relay device is in a normal ("no fault") condition as part of the process of determining the amount of back emf induced by movement of plunger 4a.

In one embodiment of the invention, an average value of the maximum back EMF or a range from 10% to 100% of the average value can be set to a threshold back EMF for operating the specific RD. In one embodiment, a range from 30% to 90% of the average value can be set to a threshold back EMF for operating the specific RD. In one embodiment, a range from 50% to 80% of the average value can be set to a threshold back EMF for operating the specific RD. Intermediate ranges of the average value can also be used for a threshold back EMF. In one embodiment of the invention, upon closing or opening a RD, the measured maximum back EMF is compared to the threshold values to ascertain if the RD state changed.

Figure 3:
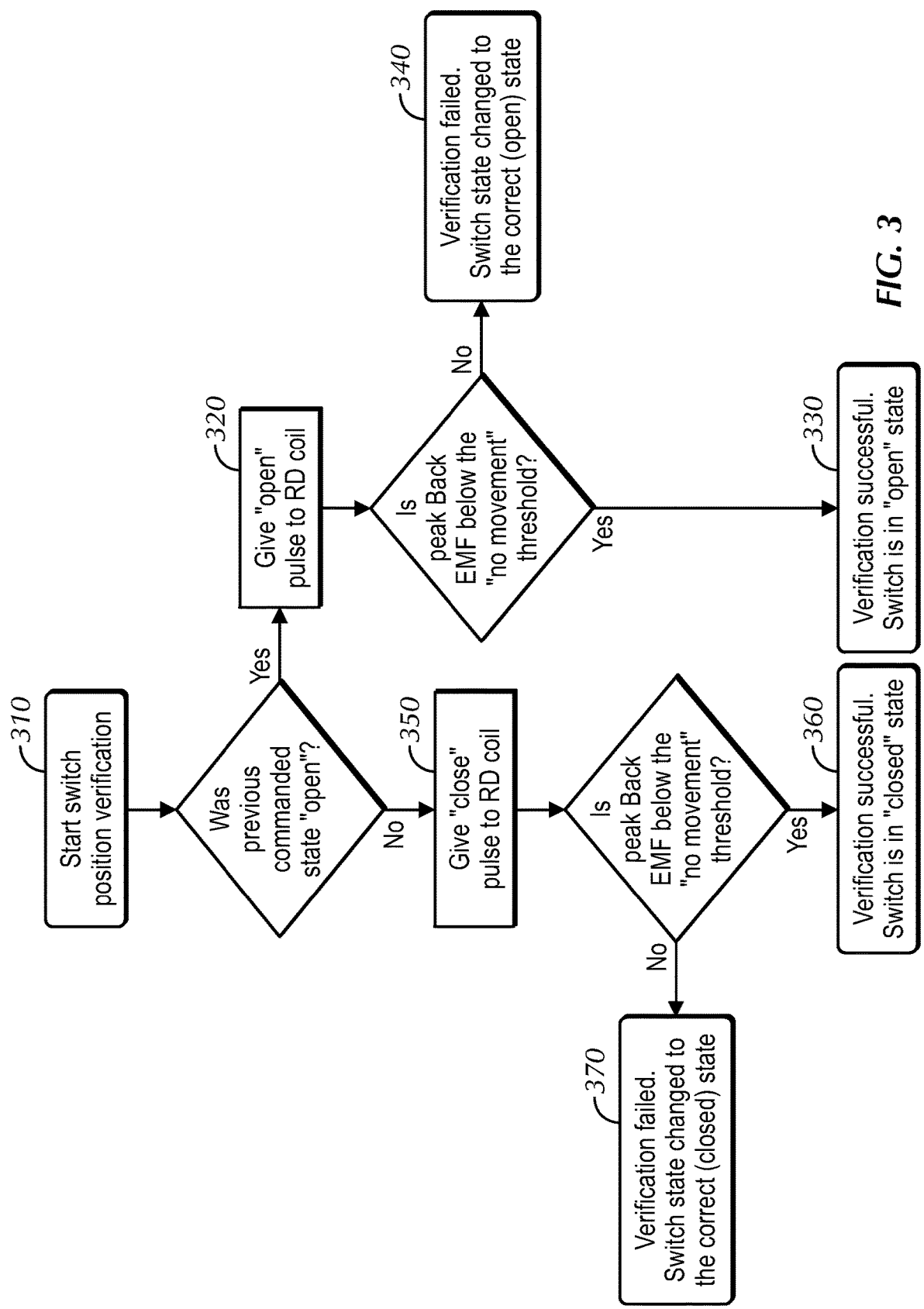
FIG. 3 is flowchart depicting a procedure of the invention for determining if a command to change the state of a latching relay was successful.

FIG. 3 is flowchart depicting a procedure that can be used to determine if a command to change the state of a latching relay resulted in a successful change of state. With reference to FIG. 3, the inventive process starts by a start/switch position verification at 310. In this verification, at 320, if the previous command state was "open," (yes), then an "open pulse" command is given to the solenoid. At 330, if the peak measured back EMF value was below the no movement threshold value, then there was no movement of the plunger in the solenoid and the "open" state was verified. The "no movement" threshold can be based on the smallest observed value of the peak back emf over all conditions of operation. However, if the peak measured back EMF value was above the no movement threshold value, then there was movement of the plunger in the solenoid, and a verification of the "open" state failed (340). Valve which was in the closed state has now been changed to the open state. The open state has been identified and confirmed.

In this verification alternative, if the previous command state was not "open," (no), then at 350 the "close pulse" command is given to solenoid. At 360, if the peak measured back EMF value was below no movement threshold value, then there was no movement of the plunger in the solenoid, and the "closed" state was verified. However, if the peak measured back EMF value was above the no movement threshold value, then at 370 there was movement of the plunger in the solenoid, and a verification of the "closed" failed (390). The valve which was in the open state has now changed to the closed state. The closed state has been identified and confirmed.

Decision logic programmed into controller 16 (or controller 54) can be used to verify the state of a relay device.

Figure 4:
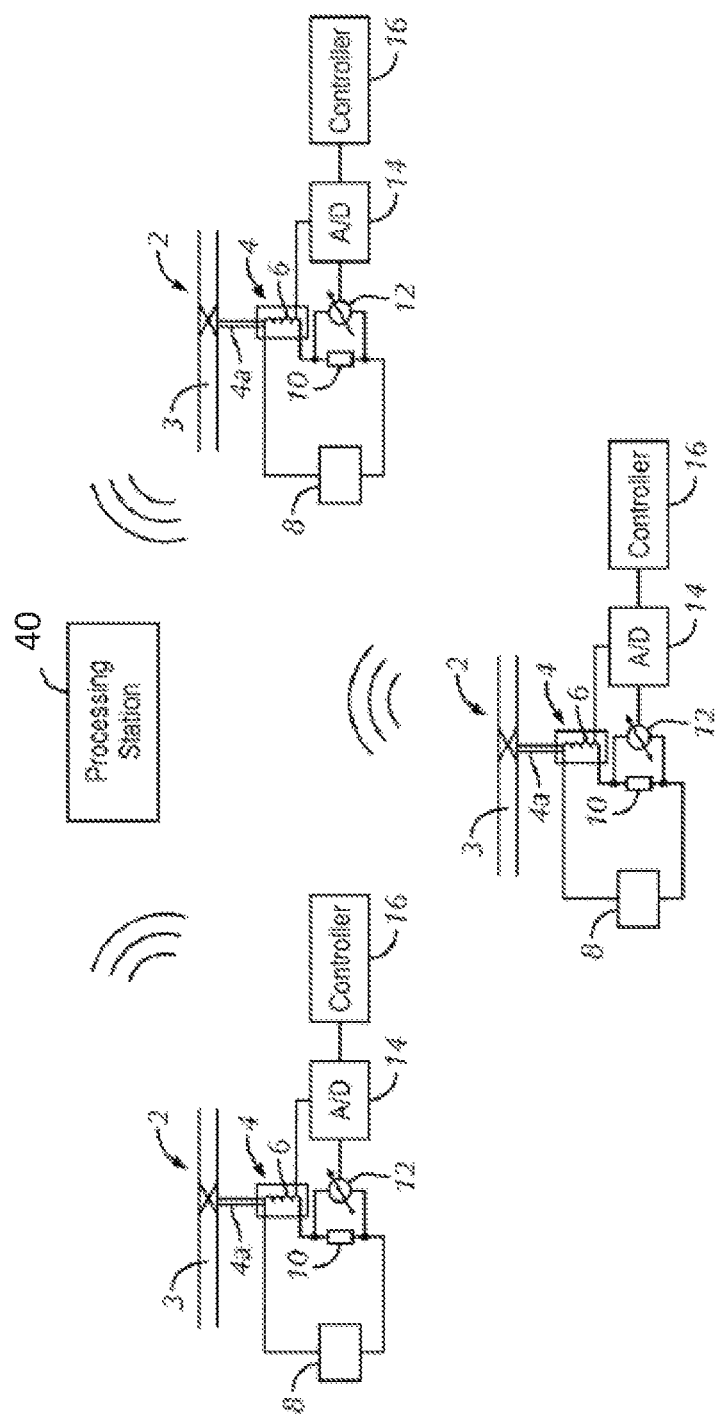
FIG. 4 is a schematic depiction of a network of relay devices according to one embodiment of the invention.

FIG. 4 is a schematic illustrating another aspect of the invention where the state of relay devices is communicated to a central processing station 40. The central processing station can be in communication for example with a plurality of relay devices on a factory floor. The central processing station can be in communication in another example with relay devices geometrically dispersed apart from each other, and wireless communication is made for example via a cell network.

Computer-Assisted Control

In one embodiment of the invention, there is provided a computer implemented system for determining the state of a relay device. For example, the controller 16 (or controller 54) can include a central processing unit (CPU) having a storage medium on which is provided a database of the movement back EMF thresholds correlated to specific relay devices.

The controller 16 (or controller 54) may include various other features such as waveform analysis functionality and decision logic to enable the controller to analyze and compare waveforms and profiles, determine waveform attributes such as slopes, inflection points, curvatures, calculate actuation delay times, etc., and to make decisions as to the state of a latching relay device, using for example the algorithms of FIG. 3. A memory may be included to store waveforms, profiles, calculated delay times, results of decisions, etc. Any of the functionality of the controller 16 may be implemented with analog and/or digital hardware, software, firmware or any suitable combination thereof.

In one example embodiment, the controller 16 (or controller 54) may be implemented as a single-board circuit board with a microcontroller having an on-board A/D converter for waveform capture, wherein controller 16 (or controller 54) is capable of capturing a current-based waveform of an energized relay coil, then analyze the captured current waveform to determine a parameter of the relay. Because the system may capture entire waveforms, it may utilize post processing of the waveforms to provide an implementation with more accurate or redundant techniques for determining the back EMF than assist in the identification of critical data points on the current curve such as the first and second inflection points shown in FIG. 2.

Figure 5:
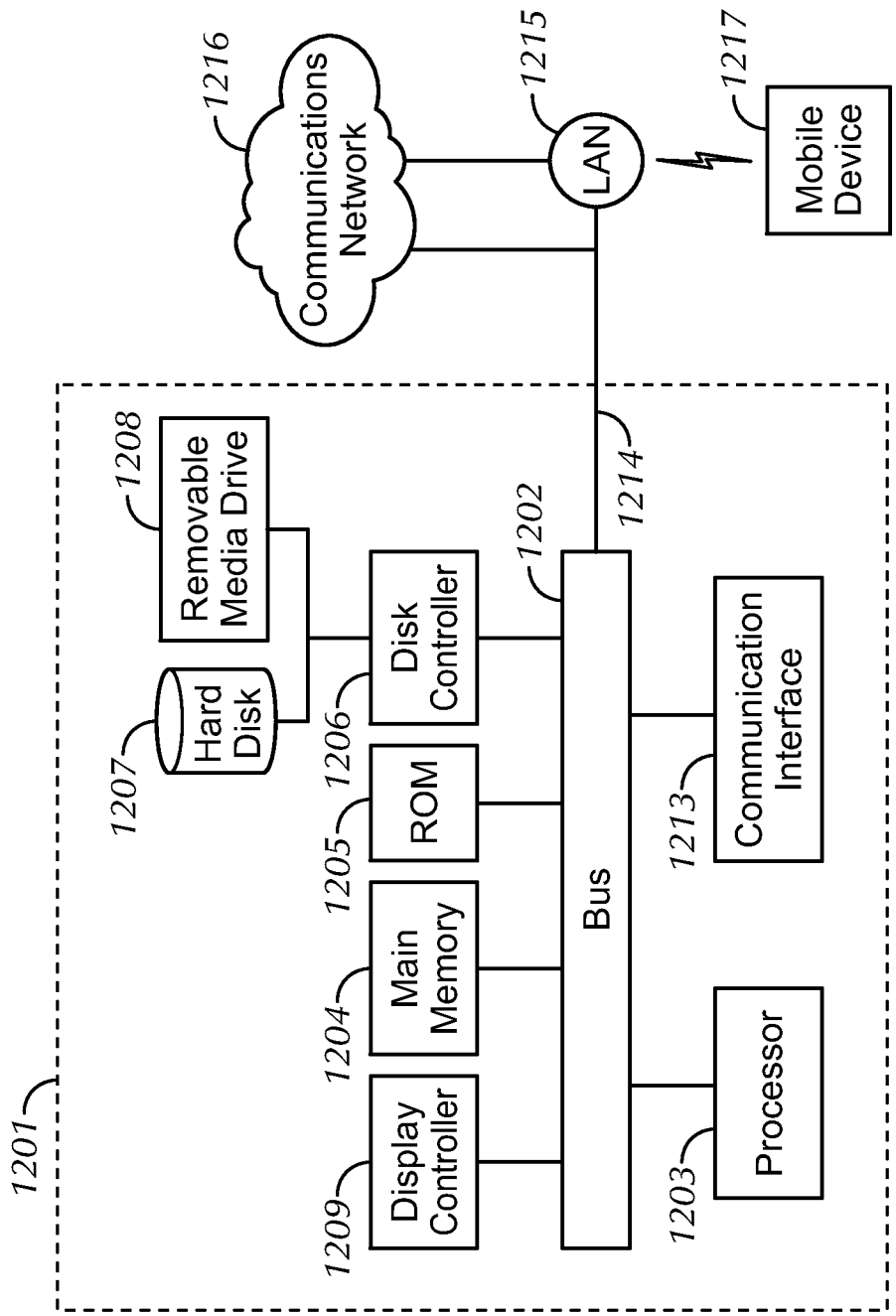
FIG. 5 is a schematic depiction of a computer system for implementing various embodiments of the invention.

FIG. 5 illustrates a computer system 1201 for implementing various embodiments of the invention. The computer system 1201 may be used as the controller 16 (or controller 54) to perform any or all of the functions described above. The computer system 1201 includes a bus 1202 or other communication mechanism for communicating information, and a processor 1203 coupled with the bus 1202 for processing the information. The computer system 1201 also includes a main memory 1204, such as a random access memory (RAM) or other dynamic storage device (e.g., dynamic RAM (DRAM), static RAM (SRAM), and synchronous DRAM (SDRAM)), coupled to the bus 1202 for storing information and instructions to be executed by processor 1203. In addition, the main memory 1204 may be used for storing temporary variables or other intermediate information during the execution of instructions by the processor 1203. The computer system 1201 further includes a read only memory (ROM) 1205 or other static storage device (e.g., programmable read only memory (PROM), erasable PROM (EPROM), and electrically erasable PROM (EEPROM)) coupled to the bus 1202 for storing static information and instructions for the processor 1203.

The computer system 1201 also includes a disk controller 1206 coupled to the bus 1202 to control one or more storage devices for storing information and instructions, such as a magnetic hard disk 1207, and a removable media drive 1208 (e.g., floppy disk drive, read-only compact disc drive, read/write compact disc drive, compact disc jukebox, tape drive, and removable magneto-optical drive). The storage devices may be added to the computer system 1201 using an appropriate device interface (e.g., small computer system interface (SCSI), integrated device electronics (IDE), enhanced-IDE (E-IDE), direct memory access (DMA), or ultra-DMA).

The computer system 1201 may also include special purpose logic devices (e.g., application specific integrated circuits (ASICs)) or configurable logic devices (e.g., simple programmable logic devices (SPLDs), complex programmable logic devices (CPLDs), and field programmable gate arrays (FPGAs)).

The computer system 1201 may also include a display controller 1209 coupled to the bus 1202 to control a display, such as a cathode ray tube (CRT), for displaying information to a computer user. The computer system may include input devices, such as a keyboard and a pointing device, for interacting with a computer user and providing information to the processor 1203. The pointing device, for example, may be a mouse, a trackball, or a pointing stick for communicating direction information and command selections to the processor 1203 and for controlling cursor movement on the display. In addition, a printer may provide printed listings of data stored and/or generated by the computer system 1201.

The computer system 1201 performs a portion or all of the processing steps (or functions) of this invention in response to the processor 1203 executing one or more sequences of one or more instructions contained in a memory, such as the main memory 1204. Such instructions may be read into the main memory 1204 from another computer readable medium, such as a hard disk 1207 or a removable media drive 1208. One or more processors in a multi-processing arrangement may also be employed to execute the sequences of instructions contained in main memory 1204. For example, the algorithm shown in FIG. 3 can be programmed with decision logic to implement the decision tree of FIG. 2. In alternative embodiments, hard-wired circuitry may be used in place of or in combination with software instructions. Thus, embodiments are not limited to any specific combination of hardware circuitry and software.

As stated above, the computer system 1201 includes at least one computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the invention includes software for controlling the computer system 1201, for driving a device or devices for implementing the invention, and for enabling the computer system 1201 to interact with a human user. Such software may include, but is not limited to, device drivers, operating systems, development tools, and applications software. Such computer readable media further includes the computer program product of the invention for performing all or a portion (if processing is distributed) of the processing performed in implementing the invention.

The computer code devices of the invention may be any interpretable or executable code mechanism, including but not limited to scripts, interpretable programs, dynamic link libraries (DLLs), Java classes, and complete executable programs. Moreover, parts of the processing of the invention may be distributed for better performance, reliability, and/or cost.

The term "computer readable medium" as used herein refers to any medium that participates in providing instructions to the processor 1203 for execution. A computer readable medium may take many forms, including but not limited to, non-volatile media, volatile media, and transmission media. Non-volatile media includes, for example, optical, magnetic disks, and magneto-optical disks, such as the hard disk 1207 or the removable media drive 1208. Volatile media includes dynamic memory, such as the main memory 1204. Transmission media includes coaxial cables, copper wire and fiber optics, including the wires that make up the bus 1202. Transmission media also may also take the form of acoustic or light waves, such as those generated during radio wave and infrared data communications.

Various forms of computer readable media may be involved in carrying out one or more sequences of one or more instructions to processor 1203 for execution. For example, the instructions may initially be carried on a magnetic disk of a remote computer. The remote computer can load the instructions for implementing all or a portion of the invention remotely into a dynamic memory and send the instructions over a telephone line using a modem. A modem local to the computer system 1201 may receive the data on the telephone line and use an infrared transmitter to convert the data to an infrared signal. An infrared detector coupled to the bus 1202 can receive the data carried in the infrared signal and place the data on the bus 1202. The bus 1202 carries the data to the main memory 1204, from which the processor 1203 retrieves and executes the instructions. The instructions received by the main memory 1204 may optionally be stored on storage device 1207 or 1208 either before or after execution by processor 1203.

The computer system 1201 also includes a communication interface 1213 coupled to the bus 1202. The communication interface 1213 provides a two-way data communication coupling to a network link 1214 that is connected to, for example, a local area network (LAN) 1215, or to another communications network 1216 such as the Internet. For example, the communication interface 1213 may be a network interface card to attach to any packet switched LAN. As another example, the communication interface 1213 may be an asymmetrical digital subscriber line (ADSL) card, an integrated services digital network (ISDN) card or a modem to provide a data communication connection to a corresponding type of communications line. Wireless links may also be implemented. In any such implementation, the communication interface 1213 sends and receives electrical, electromagnetic or optical signals that carry digital data streams representing various types of information.

The network link 1214 typically provides data communication through one or more networks to other data devices, or as shown in FIG. 4 between different relay switches and a processing station (local or remote to the relay switched). For example, the network link 1214 may provide a connection to another computer through a local network 1215 (e.g., a LAN) or through equipment operated by a service provider, which provides communication services through a communications network 1216. The local network 1214 and the communications network 1216 use, for example, electrical, electromagnetic, or optical signals that carry digital data streams, and the associated physical layer (e.g., CAT 5 cable, coaxial cable, optical fiber, etc). The signals through the various networks and the signals on the network link 1214 and through the communication interface 1213, which carry the digital data to and from the computer system 1201 may be implemented in baseband signals, or carrier wave based signals. The baseband signals convey the digital data as unmodulated electrical pulses that are descriptive of a stream of digital data bits, where the term "bits" is to be construed broadly to mean symbol, where each symbol conveys at least one or more information bits. The digital data may also be used to modulate a carrier wave, such as with amplitude, phase and/or frequency shift keyed signals that are propagated over a conductive media, or transmitted as electromagnetic waves through a propagation medium. Thus, the digital data may be sent as unmodulated baseband data through a "wired" communication channel and/or sent within a predetermined frequency band, different than baseband, by modulating a carrier wave. The computer system 1201 can transmit and receive data, including program code, through the network(s) 1215 and 1216, the network link 1214, and the communication interface 1213. Moreover, the network link 1214 may provide a connection through a LAN 1215 to a mobile device 1217 such as a personal digital assistant (PDA) laptop computer, or cellular telephone.

Generalized Statements of the Invention

The following are generalized statements of the invention not provided to limit the invention defined in the appended claims.

Statement 1. A method for monitoring a state of a relay switch, comprising: applying a voltage signal to a solenoid of the relay switch for actuation of the relay switch; monitoring over time current flowing through the solenoid after application of the voltage signal; and calculating a back-emf voltage impressed on the solenoid based on an inflection in the current occurring as a plunger of the relay switch moves.

Statement 2. The method of statement 1, further comprising determining a state of a relay switch after actuation of the relay switch by comparing the calculated back-emf voltage to a predetermined back-emf voltage associated with the relay switch in order to decide whether the relay switch changed between a closed state and an open state.

Statement 3. The method of statements 1 or 2, wherein the calculating a back-emf voltage comprises: ascertaining a rate of current rise in the solenoid prior to any inflections in the current rise; identifying a first inflection point and a second inflection point in the current flowing through the solenoid due to the plunger of the relay switch respectively starting to move and later stopping; measuring an asymptotic current level after the second inflection point; deriving a resistance and an impedance of the solenoid based respectively on the asymptotic current level and the rate of current rise; and calculating the back-emf voltage impressed on the solenoid based on one or more of a) the resistance and the impedance of the solenoid, b) a measured current at the second inflection point, and c) a measured voltage at the asymptotic current level.

Statement 4. The method of any or all of the statements above, wherein the monitoring over time comprises capturing a current-based waveform.

Statement 5. The method of statement 4, further comprising: comparing the current-based waveform to a predetermined current-based waveform for the relay device in order to determine if the relay device has a fault.

Statement 6. The method of statement 5, wherein under a no-fault condition for the relay device: determining a reduction in current flow between a first inflection point and a second inflection point; and deriving the back-emf voltage from a pre-calculated table correlating reductions in current between the first inflection point and the second inflection point to predetermined back-emfs.

Statement 7. The method of statement 6, wherein the predetermined back-emfs are calculated by: ascertaining a rate of current rise in the solenoid prior to any inflections in the current rise; measuring an asymptotic current level after the second inflection point; deriving a resistance and an impedance of the solenoid based respectively on the asymptotic current level and the rate of current rise; and calculating for arbitrary back-emf voltages the reductions in current between the first and second inflection points.

Statement 8. The method of statement 7, further comprising populating the precalculated table with the arbitrary back-emf voltages correlated to respective ones of the reductions in current between the first inflection point and second inflection point.

Statement 9. The method of any or all of the statements above, wherein the applying a voltage signal comprises applying a DC voltage to the solenoid.

Statement 10. The method of statement 9, wherein the applying a DC voltage comprises applying a stepped DC voltage to the solenoid such that the DC voltage is constant while the relay switch changes operational states.

Statement 11. The method of any or all of the statements above, further comprising: providing an open control signal to the solenoid; determining the back-emf voltage resulting from the voltage applied to the solenoid by the open control signal; comparing the determined back-emf voltage to a movement-threshold back-emf; and if the determined back-emf voltage is equal to or greater than the movement-threshold back-emf, verifying the open state.

Statement 12. The method of any or all of the statements above, further comprising: providing a close control signal to the solenoid; determining the back-emf voltage resulting from the voltage applied to the solenoid by the close control signal; comparing the determined back-emf voltage to a movement-threshold back-emf; and if the determined back-emf voltage is less than the movement-threshold back-emf, verifying the close state.

Statement 13. A relay switch comprising: a voltage source; at least one solenoid solenoid having a plunger; a switch connected to the plunger; and a controller configured to control a voltage of the voltage source and data log the voltage applied to the solenoid and a current flowing through the solenoid upon application of the voltage, wherein the controller is configured to calculate a back-emf voltage impressed on the solenoid based on an inflection in the current as the plunger of the relay switch moves.

Statement 14. The switch of statement 13, wherein the controller is configured to determine a state of a relay switch after actuation of the relay switch by comparing the calculated back-emf voltage to a predetermined back-emf voltage associated with the relay switch in order to decide whether the relay switch changed between a closed state and an open state Statement 15. The switch of statements 13 or 14, further comprising an analogue to digital converter providing the controller with digitized signals of the voltage and the current.

Statement 16. The switch of any or all of the switch statements above, wherein the controller is configured to: compare the calculated back-emf voltage to a predetermined back-emf voltage associated with the relay switch in order to determine whether the relay switch changed between a closed state and an open state.

Statement 17. The switch of any or all of the switch statements above, wherein the controller is configured to apply a voltage signal comprises applying a DC voltage to the solenoid.

Statement 18. The switch of statement 17, wherein the controller is configured to apply a stepped DC voltage to the solenoid such that the DC voltage is constant while the relay switch changes operational states.

Statement 19. The switch of any or all of the switch statements above, wherein the controller is configured to: provide an open control signal to the solenoid; determine the back-emf voltage resulting from the voltage applied to the solenoid by the open control signal; compare the determined back-emf voltage to a movement-threshold back-emf; and if the determined back-emf voltage is equal to or greater than the movement-threshold back-emf, verify the open state.

Statement 20. The switch of any or all of the switch statements above, wherein the controller is configured to: provide a close control signal to the solenoid; determine the back-emf voltage resulting from the voltage applied to the solenoid by the close control signal; compare the determined back-emf voltage to a movement-threshold back-emf; and if the determined back-emf voltage is less than the movement-threshold back-emf, verify the close state.

Statement 21. A method for determining a state of a relay switch after actuation of the relay switch. The method may utilize any of the method statements above and compares a calculated back-emf voltage to a predetermined back-emf voltage associated with the relay switch in order to decide whether the relay switch changed between a closed state and an open state.

Statement 22. A system for determining a state of a relay switch after actuation of the relay switch. The system includes a voltage source, at least one solenoid solenoid having a plunger, a switch connected to the plunger, and a controller configured to data log the voltage applied to the solenoid and the current flowing through the solenoid upon application of the voltage.

Statement 23. The system of statement 22, wherein the controller is configured to compare a calculated back-emf voltage to a predetermined back-emf voltage associated with the relay switch in order to decide whether the relay switch changed between a closed state and an open state.

Statement 24. The system of statements 22 or 23 utilizing any or all of the switch statements 13-20.

Numerous modifications and variations of the invention are possible in light of the above teachings. It is therefore to be understood that within the scope of the appended claims, the invention may be practiced otherwise than as specifically described herein.

The invention claimed is:

1. A method for monitoring a state of a relay switch, comprising:
   applying a voltage signal to a solenoid of the relay switch for actuation of the relay switch;
   monitoring over time current flowing through the solenoid after application of the voltage signal; and
   calculating a maximum back-emf voltage impressed on the solenoid based on measured values of the current flowing through the solenoid including a) a minimum value of the current at an inflection in the current occurring as a plunger of the relay switch moves and b) an asymptotic value of the current after the plunger has stopped movement.

2. The method of claim 1, further comprising determining a state of a relay switch after actuation of the relay switch by comparing the calculated maximum back-emf voltage to a predetermined back-emf voltage associated with the relay switch in order to decide whether the relay switch changed between a closed state and an open state.

3. The method of claim 1, wherein the calculating the maximum back-emf voltage comprises:

ascertaining a rate of current rise in the solenoid prior to any inflections in the current rise;
identifying a first inflection point and a second inflection point in the current flowing through the solenoid due to the plunger of the relay switch respectively starting to move and later stopping;
measuring the asymptotic value of the current;
deriving a resistance and an impedance of the solenoid based respectively on the asymptotic value of the current and the rate of current rise; and
calculating the maximum back-emf voltage impressed on the solenoid based on the resistance and the impedance of the solenoid, a measured current at the second inflection point, and the asymptotic value of the current.

4. The method of claim 1, wherein the applying a voltage signal comprises applying a DC voltage to the solenoid.

5. The method of claim 4, wherein the applying a DC voltage comprises applying a stepped DC voltage to the solenoid such that the DC voltage is constant while the relay switch changes operational states.

6. The method of claim 1, further comprising:
providing an open control signal to the solenoid;
determining the maximum back-emf voltage resulting from the voltage applied to the solenoid by the open control signal;
comparing the determined maximum back-emf voltage to a movement-threshold back-emf; and
if the determined maximum back-emf voltage is equal to or greater than the movement-threshold back-emf, verifying the open state.

7. The method of claim 1, further comprising:
providing a close control signal to the solenoid;
determining the maximum back-emf voltage resulting from the voltage applied to the solenoid by the close control signal;
comparing the determined maximum back-emf voltage to a movement-threshold back-emf; and
if the determined maximum back-emf voltage is less than the movement-threshold back-emf, verifying the close state.

8. A method for monitoring a state of a relay switch, comprising:
capturing a current-based waveform; and
determining from the current-based waveform a maximum back-emf voltage of the relay device by using waveform processing and analysis to determine a) first and second infection points on the waveform, b) a minimum value of the current at the second inflection point on the waveform, and c) an asymptotic value of the current on the waveform after the second inflection point.

9. The method of claim 8, further comprising:
monitoring over time and comparing the current-based waveform to a predetermined current-based waveform for the relay device in order to determine if the relay device has a fault.

10. The method of claim 9, wherein under a no-fault condition for the relay device:
determining a reduction in current flow between a first inflection point and a second inflection point; and
deriving the maximum back-emf voltage from a precalculated table correlating reductions in current between the first inflection point and the second inflection point to predetermined back-emfs.

11. The method of claim 10, wherein the predetermined back-emfs are calculated by:
ascertaining a rate of current rise in the solenoid prior to any inflections in the current rise;
measuring an asymptotic current level after the second inflection point;
deriving a resistance and an impedance of the solenoid based respectively on the asymptotic current level and the rate of current rise; and
calculating for arbitrary back-emf voltages the reductions in current between the first and second inflection points.

12. The method of claim 11, further comprising populating the precalculated table with the arbitrary back-emf voltages correlated to respective ones of the reductions in current between the first inflection point and second inflection point.

13. A relay switch comprising:
a voltage source;
at least one solenoid having a plunger;
a switch connected to the plunger; and
a controller configured to control a voltage of the voltage source and data log the voltage applied to the solenoid and a current flowing through the solenoid upon application of the voltage,
wherein the controller is configured to calculate a maximum back-emf voltage impressed on the solenoid based on measured values of the current flowing through the solenoid including a) a minimum value of the current at an inflection in the current occurring as a plunger of the relay switch moves and b) an asymptotic value of the current after the plunger has stopped movement.

14. The switch of claim 13, wherein the controller is configured to determine a state of a relay switch after actuation of the relay switch by comparing the calculated maximum back-emf voltage to a predetermined back-emf voltage associated with the relay switch in order to decide whether the relay switch changed between a closed state and an open state.

15. The switch of claim 13, further comprising an analogue to digital converter providing the controller with digitized signals of the voltage and the current.

16. The switch of claim 13, wherein the controller is configured to:
compare the calculated maximum back-emf voltage to a predetermined back-emf voltage associated with the relay switch in order to determine whether the relay switch changed between a closed state and an open state.

17. The switch of claim 13, wherein the controller is configured to apply a voltage signal comprises applying a DC voltage to the solenoid.

18. The switch of claim 17, wherein the controller is configured to apply a stepped DC voltage to the solenoid such that the DC voltage is constant while the relay switch changes operational states.

19. The switch of claim 13, wherein the controller is configured to:
provide an open control signal to the solenoid;
determine the maximum back-emf voltage resulting from the voltage applied to the solenoid by the open control signal;
compare the determined maximum back-emf voltage to a movement-threshold back-emf; and
if the determined maximum back-emf voltage is equal to or greater than the movement-threshold back-emf, verify the open state.

20. The switch of claim 13, wherein the controller is configured to:
- provide a close control signal to the solenoid;
- determine the maximum back-emf voltage resulting from the voltage applied to the solenoid by the close control signal;
- compare the determined maximum back-emf voltage to a movement-threshold back-emf; and
- if the determined maximum back-emf voltage is less than the movement-threshold back-emf, verify the close state.

* * * * *